(12) United States Patent
Denham

(10) Patent No.: US 6,462,363 B1
(45) Date of Patent: Oct. 8, 2002

(54) COMPACT, ALL-LAYERS-PROGRAMMABLE INTEGRATED CIRCUIT ARRANGEMENTS

(75) Inventor: Martin S. Denham, Yamhill, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/475,058

(22) Filed: Dec. 30, 1999

(51) Int. Cl.[7] .............................................. H01L 27/10
(52) U.S. Cl. ...................................... 257/209; 257/390
(58) Field of Search ................................ 257/390, 209

(56) References Cited

U.S. PATENT DOCUMENTS 4,352,031 A * 9/1982 Holbrook et al. ........... 307/444

* cited by examiner

*Primary Examiner*—Douglas A. Willie
*Assistant Examiner*—Wai-Sing Louie
(74) *Attorney, Agent, or Firm*—Antonelli, Terry, Stout & Kraus, LLP

(57) ABSTRACT

The invention is directed to a programmable IC (integrated circuit) arrangement. Included are: at least one input/output terminal; at least two receiver/source terminals for selectable electrical connection to the at least one input/output terminal; and a plurality of layers electrically interconnected with one another and providing electrical connection between the at least one input/output terminal and at least one of the at least two receiver/source terminals. At least a sub-plurality of the plurality of layers includes electrically conductive components selectably providable at at least two positions so as to selectably program electrical connection between the at least one input/output terminal and the at least two receiver/ source terminals. The selectably providable electrically conductive components include ones of selectably providable vias, switch-contacts and well regions. The plurality of layers can include any of differing types of layers selected from the group of semiconductor well, diffusion, polysilicon, contact, metal conductor and vias layers. In a disclosed example embodiment, the programmable IC arrangement is a ROM (read-only-memory) cell having two input/output terminals, and where the electrically conductive components selectably program electrical connection between the two input/output terminals and two receiver/ source terminals. Portions of the plurality of layers which include the electrically conductive components are substantially stacked substantially in alignment with each other.

24 Claims, 11 Drawing Sheets

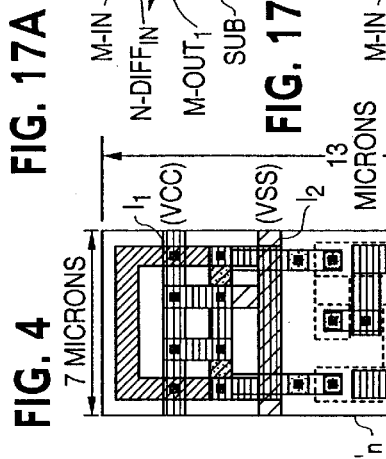
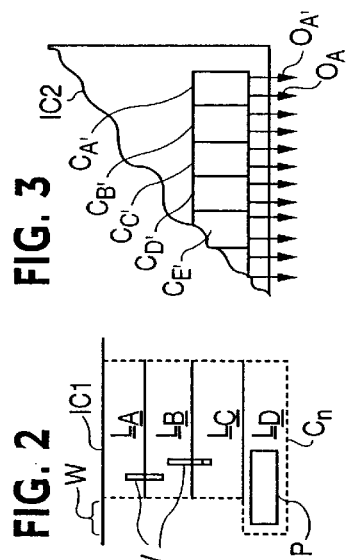
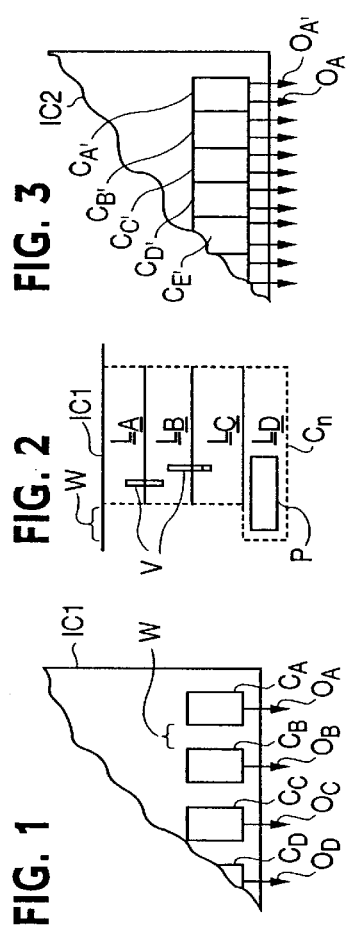

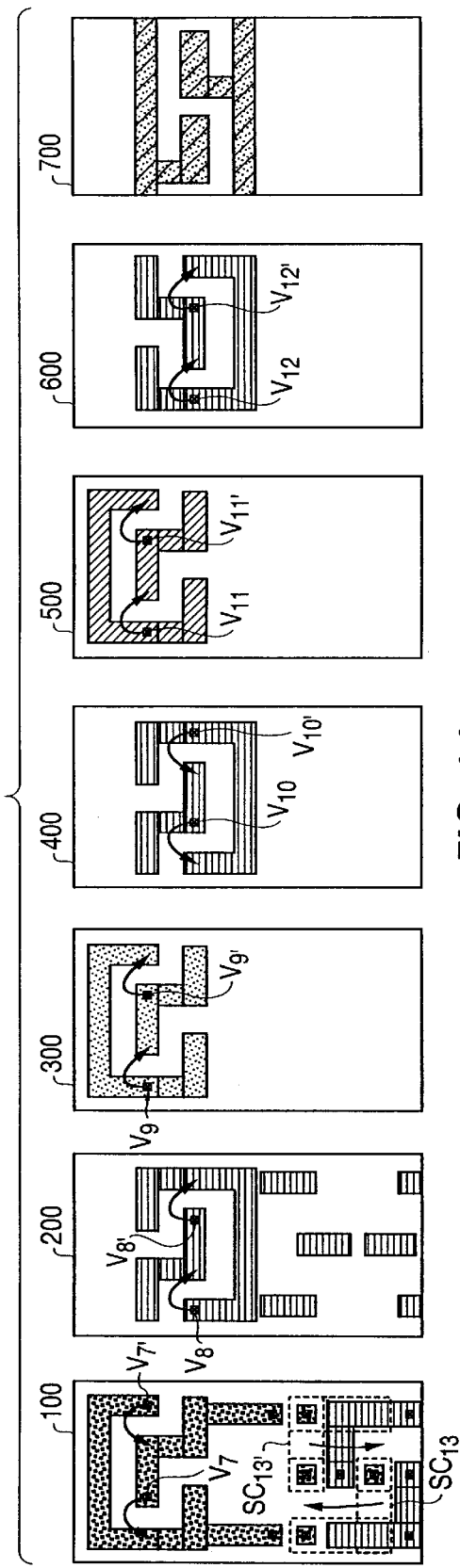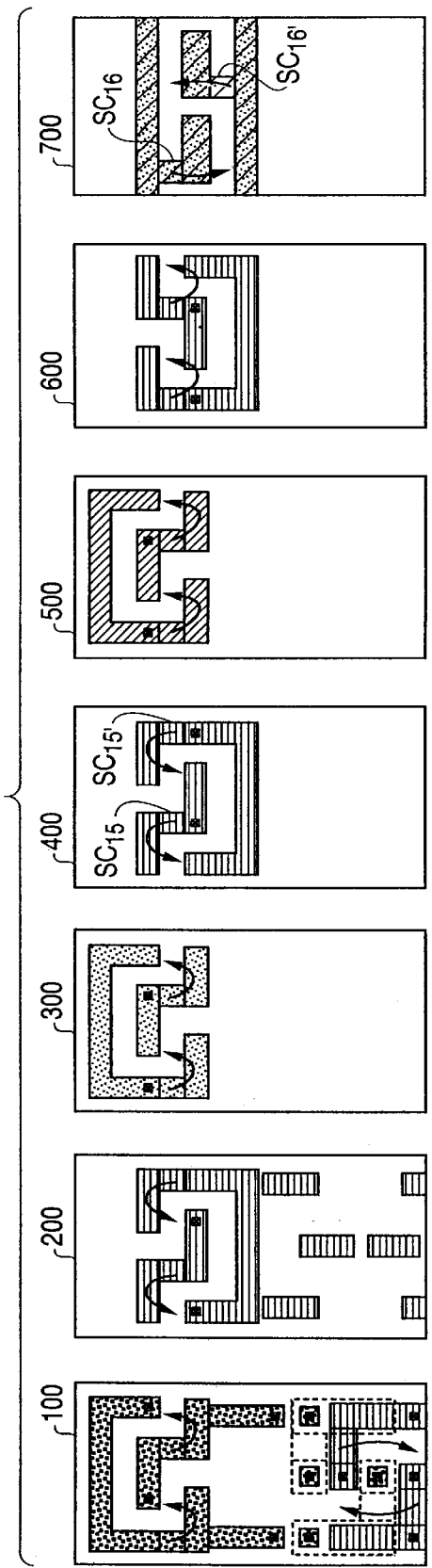

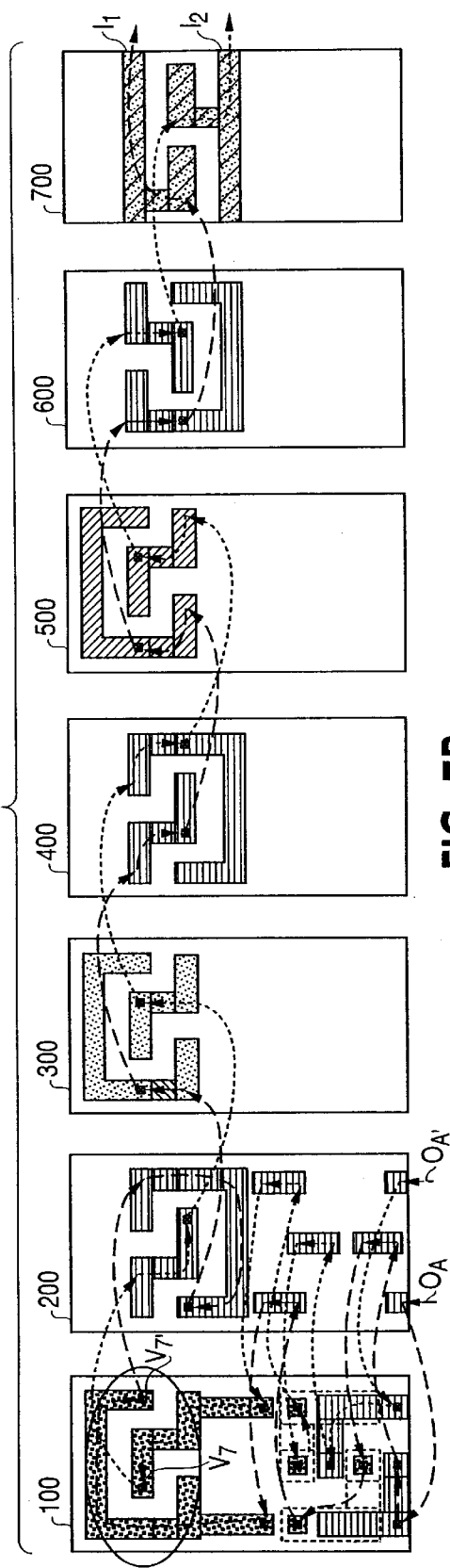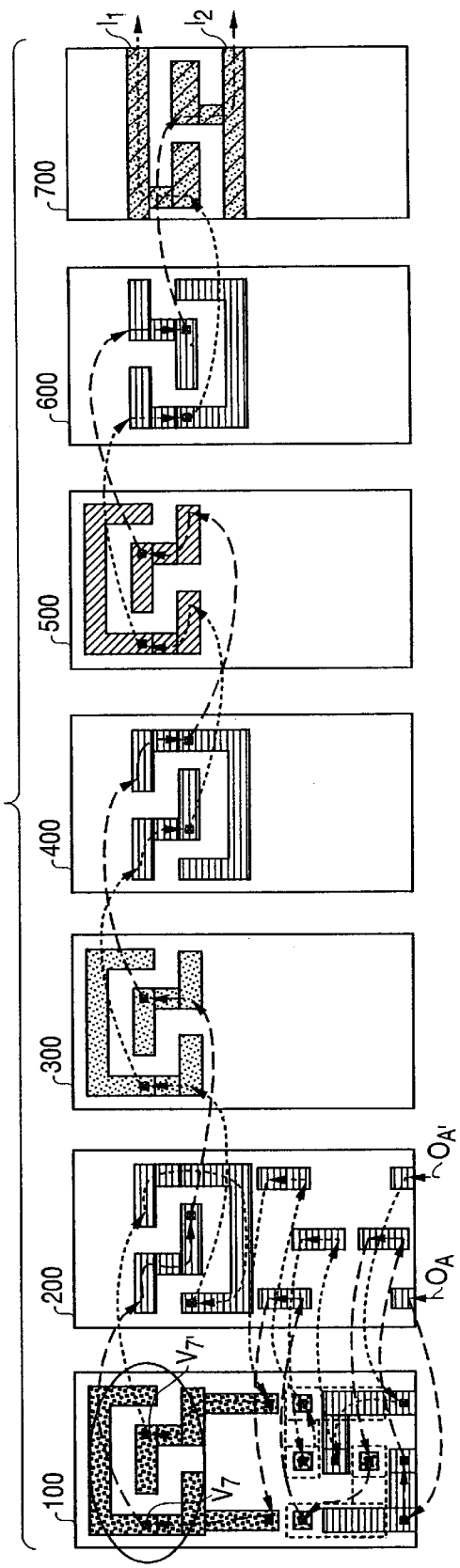

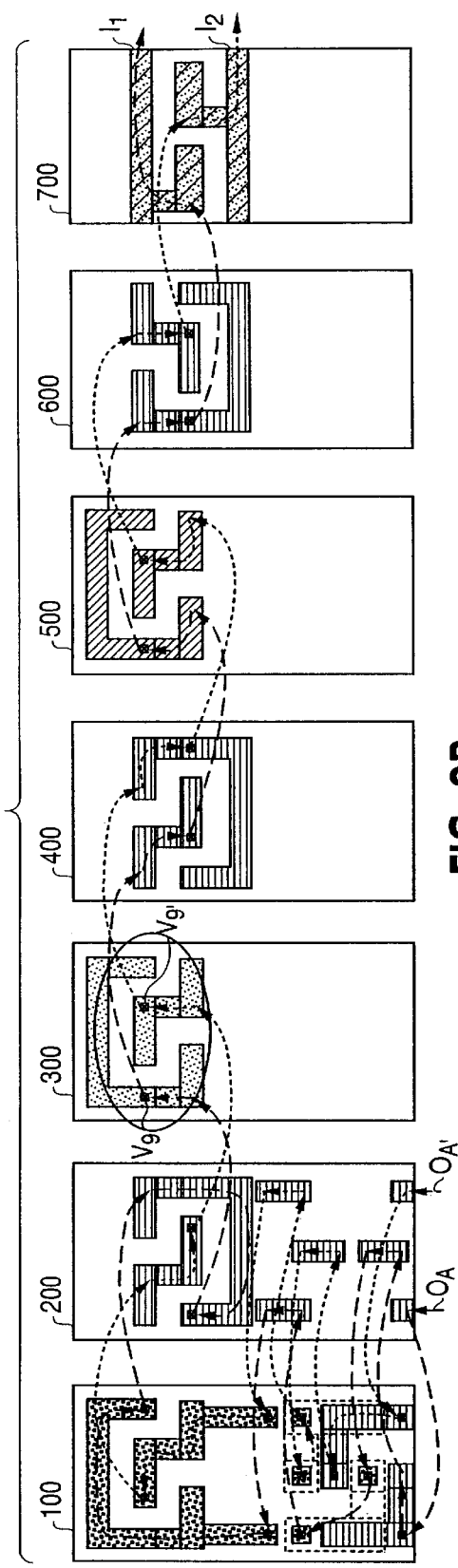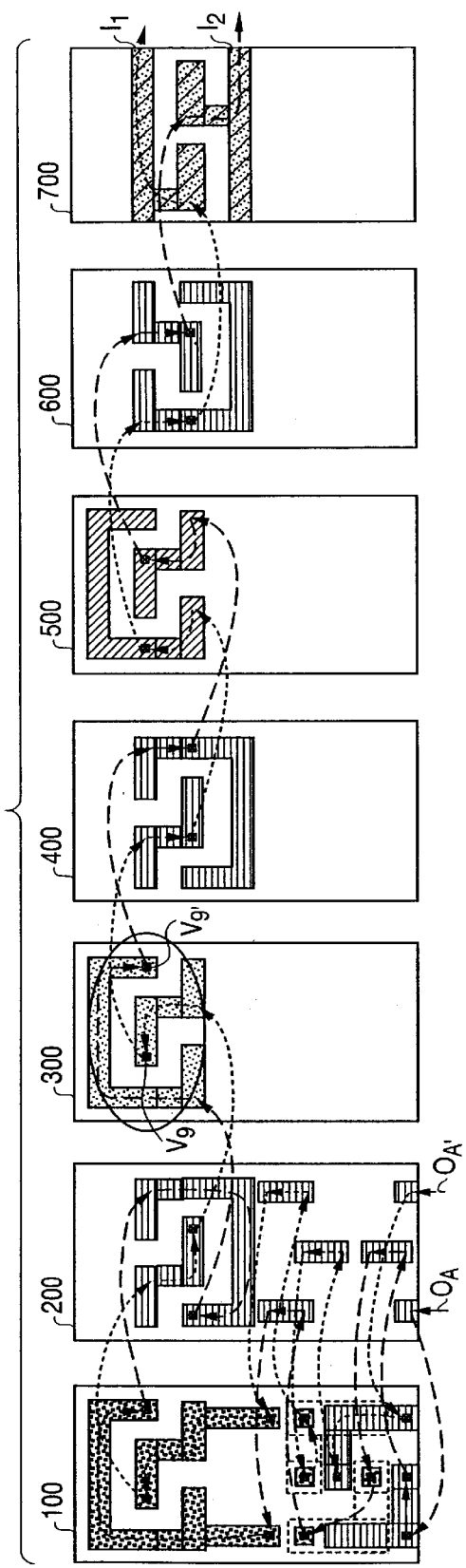

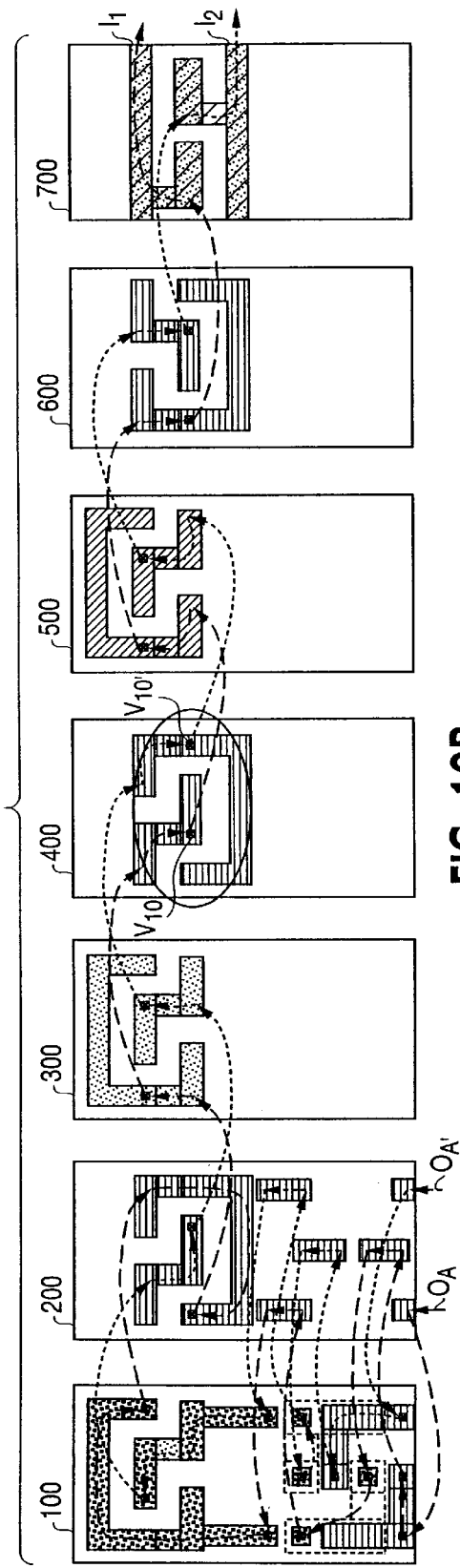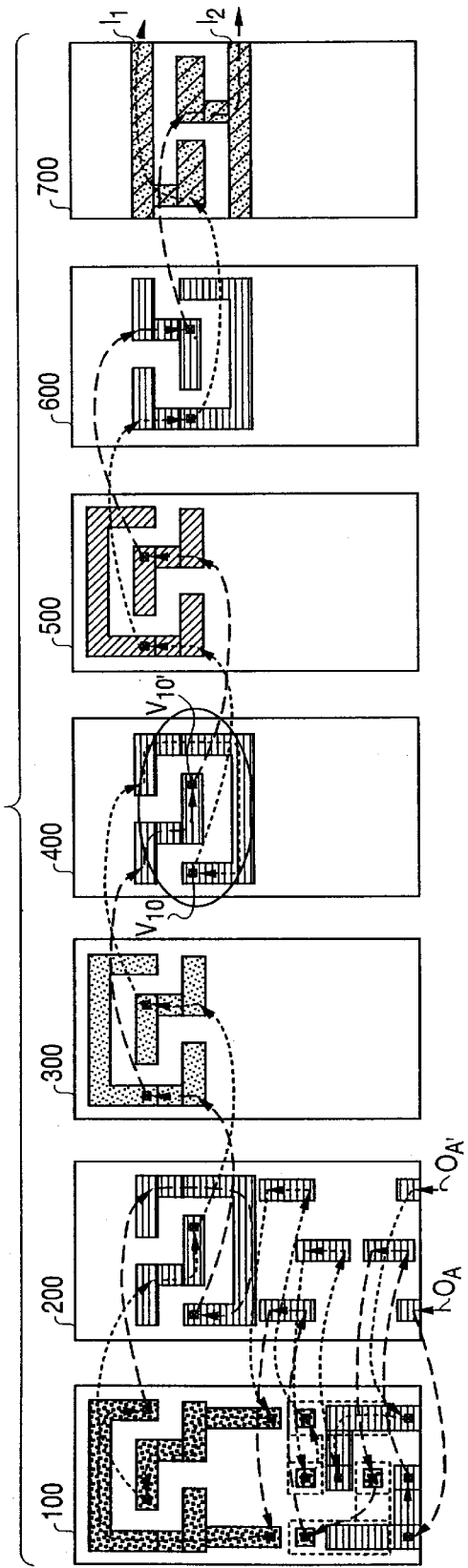

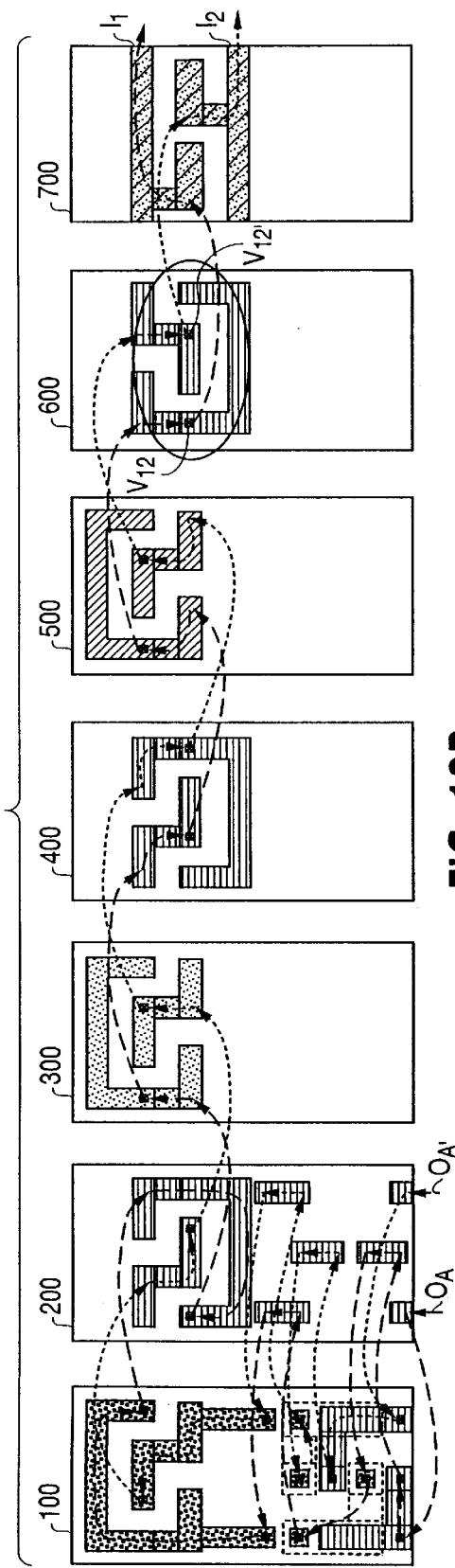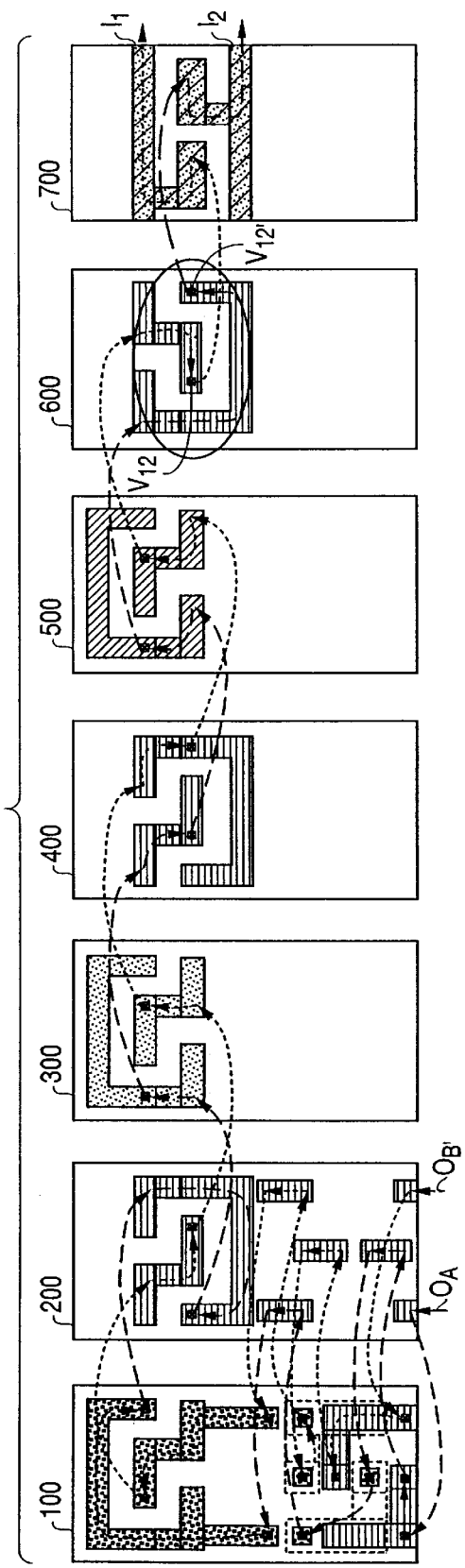

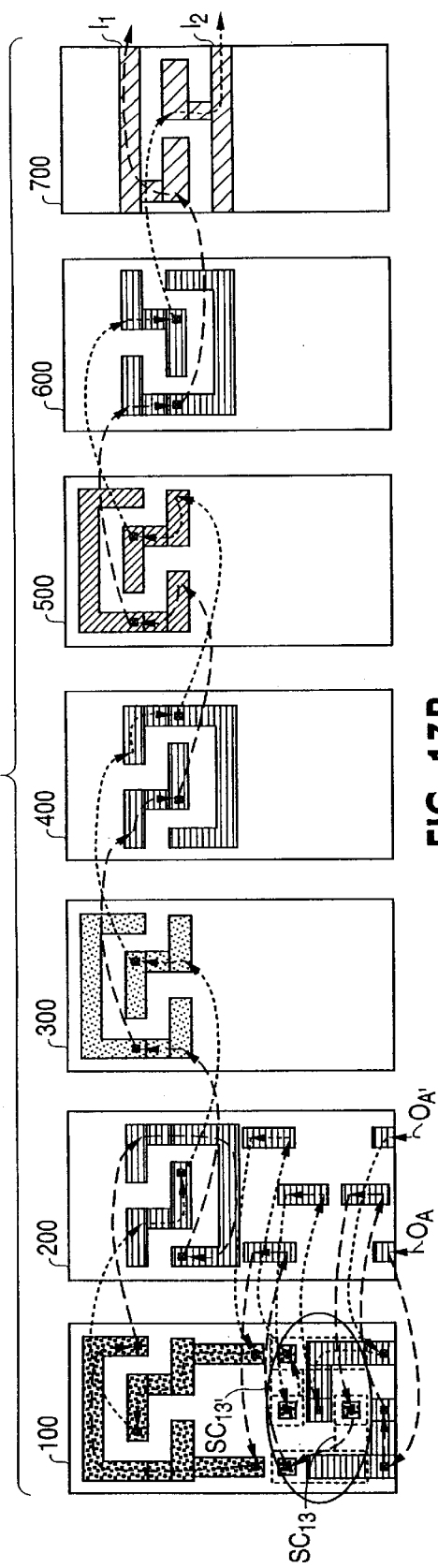
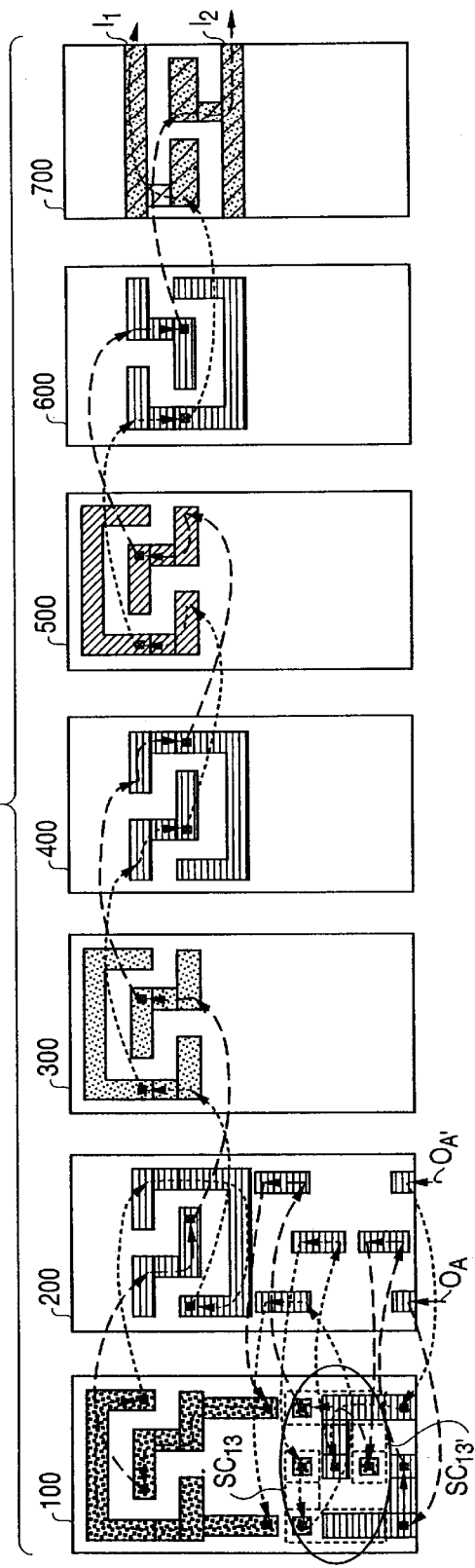
FIG. 13A
FIG. 13B

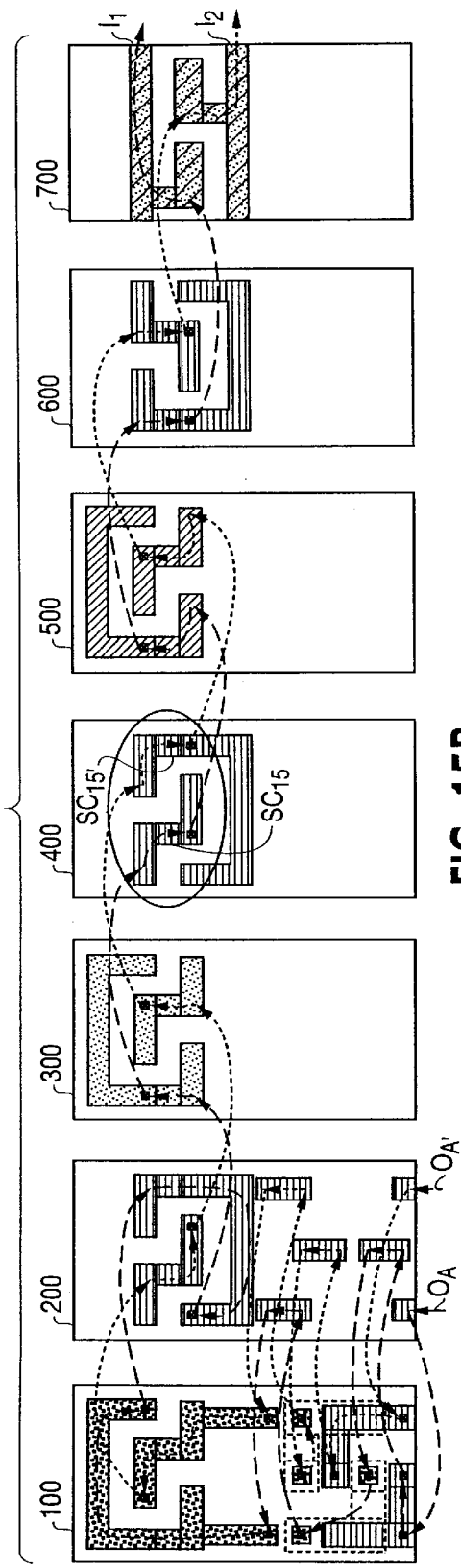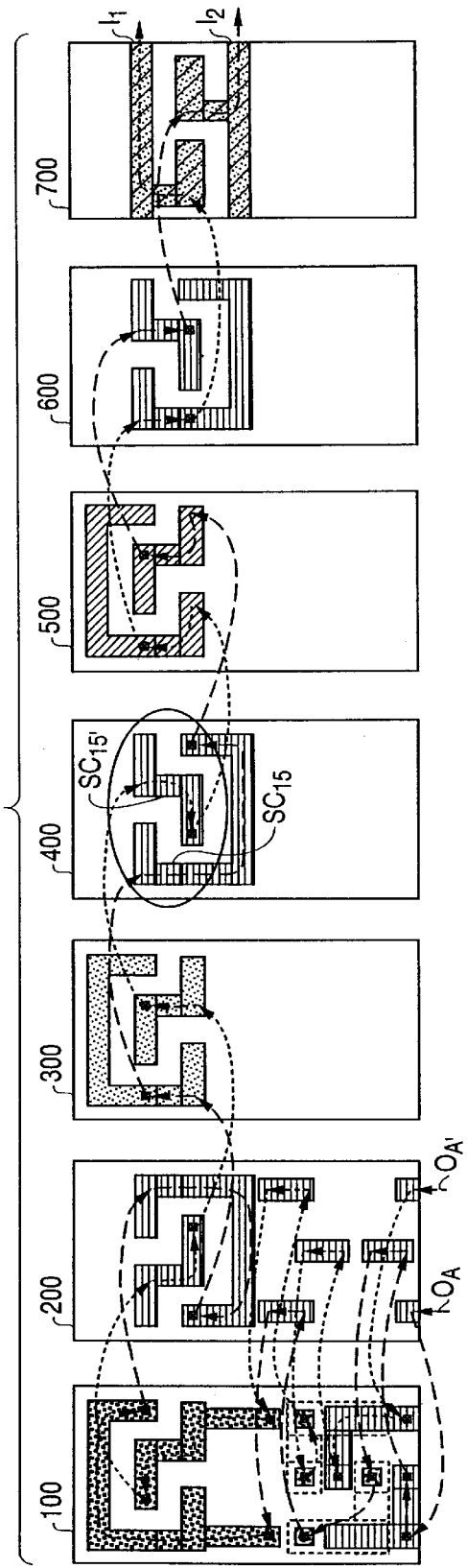

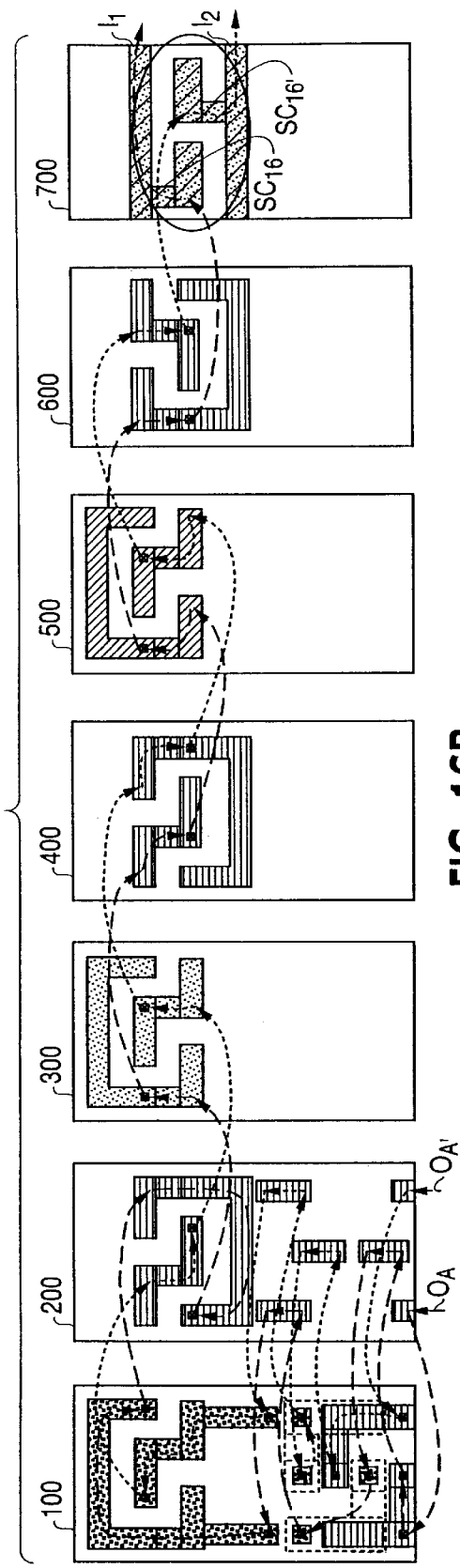
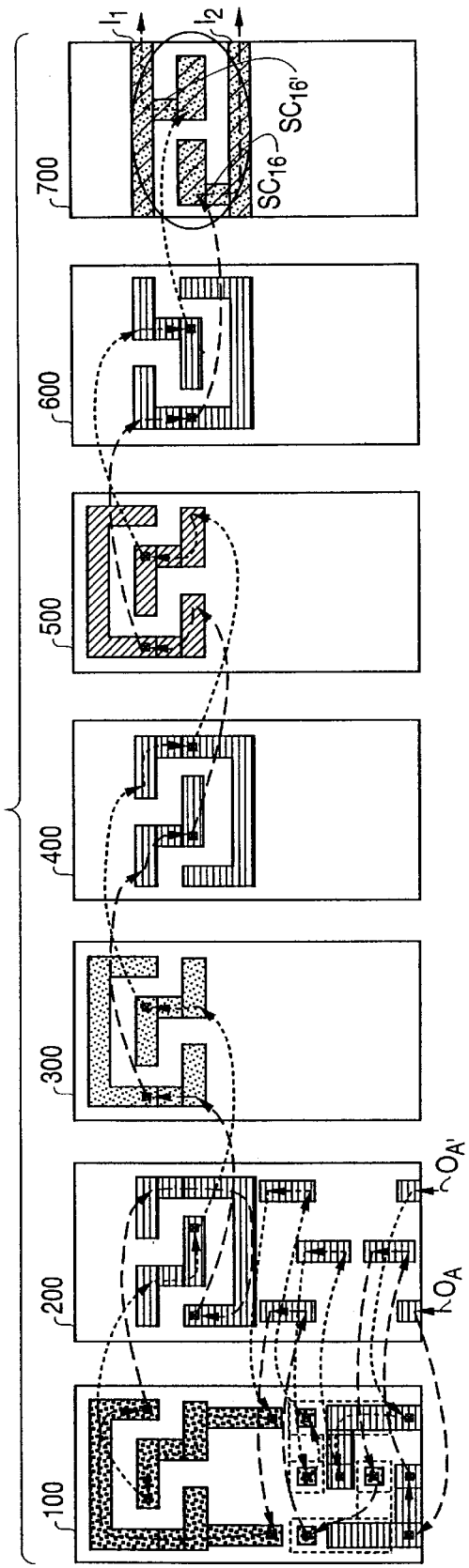

COMPACT, ALL-LAYERS-PROGRAMMABLE INTEGRATED CIRCUIT ARRANGEMENTS

FIELD

The present invention generally relates to compact, stacked layer configurations for integrated circuits, which allow programmability on each layer.

BACKGROUND

Although a ROM (read-only-memory) cell and a version number associated with an IC (integrated circuit) will be used to describe examples of both the background and the invention, practice of the present invention is not limited to the same.

Turning first to a background, FIG. 1 illustrates a portion of an integrated circuit IC1. Often ICs include groups of ROM cells which are pre-programmed during IC design, with such preprogramming propagating through manufacturing, to provide desired values or code. For example, in FIG. 1, IC1 has an example plurality of ROM cells $C_A$, $C_B$, $C_C$, $C_D$, . . . , having outputs $O_A$, $O_B$, $O_C$, $O_D$, . . . , respectively. Each ROM cell may have a selectably programable physical arrangement which can be arranged during IC design and/or manufacturer, so as to program the ROM cell to output a desired value. For example, FIG. 2 shows an example cross-section of an example ROM cell $C_n$.

Such ROM cell is typically formed of a plurality of layers, for example, the ROM cell $C_n$ may have layers $L_A$, $L_B$, $L_C$, $L_D$, and some of the layers may be electrically interconnected with other layers using vias layers V. The layers $L_A$, $L_B$, $L_C$, $L_D$ may be any of a plurality of different types, for example, semiconductor well, diffusion, polysilicon, contacts, metal conductor, vias, etc. constructions, with such layers being resultant from a plurality of different masks (and other processes) applied during IC manufacturing. One of such layers may have the above-discussed selectably programmable portion P, i.e., so as to be selectably programmable during IC design and/or manufacture so as to configure or program the ROM cell according to at least two possible choices, e.g., to output a logical "1" or logical "0", a first voltage level Vcc or a second voltage level Vss, etc.

As one example of a use of groups of ROM cells on an IC, often times after IC manufacturing, numerous different versions, generations or lots (hereinafter, "versions") of an IC chip will be design modified (e.g., improved) and/or modified during manufacturing in a strive to remove paracitics and/or unwanted behavior and/or improve performance, e.g., often by changing a layout of one or more masks which were used to pattern the IC from one version to another. During subsequent analysis/comparison of the differing version IC chips, often it becomes important to be able to determine to which version a particular IC chip belongs. Accordingly, in order to meet such need, the outputs $O_A$, $O_B$, $O_C$, $O_D$, . . . , of the FIG. 1 example plurality of ROM cells $C_A$, $C_B$, $C_C$, $C_D$, . . . , respectively, could be programmed (i.e., constructed) during design and/or manufacture to output a version number of the IC, e.g., to output a binary value of "0001" for a first version IC, a binary value of "0010"for a second version IC, etc. If desired, such outputs from the ROM cells could then be accessed during analysis/comparison to determine to which version a particular chip belongs.

In addition, several differing groups of ROM cells could be used to separately provide differing information, for example, a first group of ROM cells could be used to provide a unique serial number for the IC chip, a second group could be used to identify the exact masks used for a first type of layer (e.g., metal layer), a third group could be used to identify the exact masks used for a second type of layer, another group could be used to identify a date or manufacturing plant of manufacture. Such information could then be used for IC chip identification purposes, or for verification purposes, e.g., to check to see if the proper sets of masks were used.

Discussion turns next to disadvantages with the FIGS. 1–2 arrangement. More particularly, a first disadvantage with the FIGS. 1–2 arrangement is that such ROM cells are not programmable at each layer. More particularly, assume that after analysis of a first version IC, it is determined that a configuration of the FIG. 2 layer $L_B$ should be changed in order to remove a paracitics and/or unwanted behavior and/or improve performance. Accordingly, a mask used to produce this layer $L_B$ may be changed. Since any IC manufactured with this changed mask would represent a new version IC, the version number programmed within the ROM cells $C_A$, $C_B$, $C_C$, $C_D$, . . . , should also be changed. However, since the programmable portions P of the ROM cells are not within the layer $L_B$ and instead are within layer $L_D$, a mask for the programmable layer $L_D$ must also be changed in order to change the IC version number. The required change of two masks instead of just one is a disadvantage in terms of increased manufacturing complexity, costs and increased time-to-market (TtM) delays.

As a second disadvantage, a size of the programmable portion P may be larger than other arrangements within the ROM cell and may increase a size of each ROM cell, such that the ROM cells $C_A$, $C_B$, $C_C$, $C_D$, . . . , have substantial wasted die space W (FIG. 1) therebetween. Wasted die space is incompatible with present day trends toward increased miniaturization and lowered IC costs, and therefore is disadvantageous.

SUMMARY

The invention is directed to a programmable IC (integrated circuit) arrangement. Included are: at least one input/output terminal; at least two receiver/source terminals for selectable electrical connection to the at least one input/output terminal; and a plurality of layers electrically interconnected with one another and providing electrical connection between the at least one input/output terminal and at least one of the at least two receiver/source terminals. At least a sub-plurality of the plurality of layers includes electrically conductive components selectably providable at at least two positions so as to selectably program electrical connection between the at least one input/output terminal and the at least two receiver/source terminals.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein:

FIG. 1 illustrates a portion of an example disadvantageous integrated circuit which includes an example disadvantageous group of ROM cells;

FIG. 2 shows an example cross-section of an example disadvantageous ROM cell of the arrangement of FIG. 1;

FIG. 3 illustrates a portion of an example advantageous integrated circuit which includes an example advantageous group of ROM cells according to the present invention;

FIG. 4 shows an example plan view of an example advantageous ROM cell of the arrangement of FIG. 3;

FIG. 5 shows a plurality of plan views more clearly showing example individual layers and/or components of the example advantageous ROM cell of FIG. 4;

FIG. 6 shows a plurality of plan views more clearly showing ones of example selectably programmable vias and switch-contact components with respect to the individual layers and/or components of the example advantageous ROM cell of FIGS. 4–5;

FIGS. 7A, 7B, 8A, 8B, 9A, 9B, 10A, 10B, 11A, 11B, 12A and 12B, show electrical conduction paths through the FIG. 6 plan views, for showing that a programmable move of any one of the example vias pairs $V_7$, $V_7'$, $V_8$, $V_8'$, $V_9$, $V_9'$, $V_{10}$, $V_{10}'$, $V_{11}$, $V_{11}'$, and $V_{12}$, $V_{12}'$, results in a reversal of connections between the two interconnectors $I_1$, $I_2$ and the two input/output terminals $O_A$, $O_A'$;

FIGS. 13A, 13B, show electrical conduction paths through the FIG. 6 plan views, for showing that a programmable move of an example switch-contact pair $SC_{13}$, $SC_{13}'$ within an N-WELL layer, results in a reversal of connections between the two interconnectors $I_1$, $I_2$ and the two input/output terminals $O_A$, $O_A'$;

FIG. 14 shows a plurality of example plan views more clearly showing ones of other example selectably programmable switch-contact components with respect to the individual layers and/or components of the example advantageous ROM cell of FIG. 4;

FIGS. 15A, 15B, and 16A, 16B show electrical conduction paths through the FIG. 14 plan views, for showing that a programmable move of any one of the example switch-contact pairs $SC_{15}$, $SC_{15}'$ and $SC_{16}$, $SC_{16}'$ within any one of example METAL3 and IMETAL layers, respectively, results in a reversal of connections between the two interconnectors $I_1$, $I_2$ and the two input/output terminals $O_A$, $O_A'$; and, FIGS. 17A, 17B show plan views of a selectably programmable well arrangement.

DETAILED DESCRIPTION

Figure 8A:
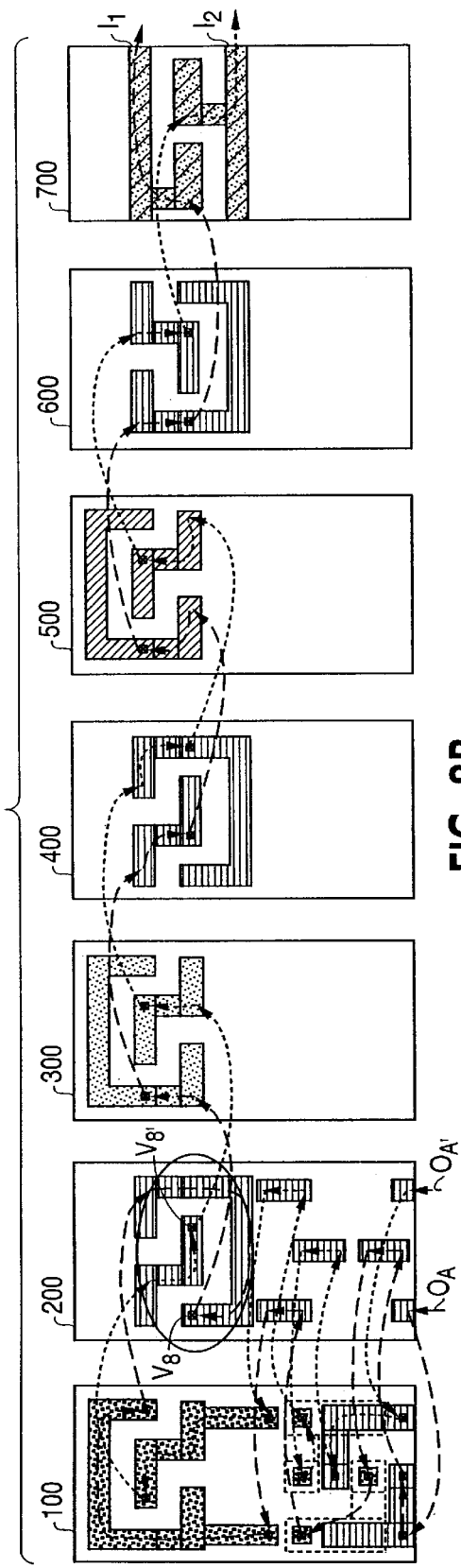

Before beginning a detailed description of the subject invention, mention of the following is in order. When appropriate, like reference numerals and characters may be used to designate identical, corresponding or similar components in differing figure drawings. Further, in the detailed description to follow, example sizes/values/ranges may be given, although the present invention is not limited to the same. As a final note, well known power/ground connections, insulation layers and other components may not be shown within the FIGS. for simplicity of illustration and discussion, and so as not to obscure the invention.

As a prelude to more detailed description of the invention, an overview of the invention is appropriate. More particularly, embodiments of the invention are directed to a multi-layered electrical configuration where an output can be modified by modifying any one of its constituent layers.

Turning now to detailed description of an example embodiment of the invention, FIG. 3 illustrates a portion of an example advantageous integrated circuit IC2 which includes an example advantageous group of ROM cells $C_A'$, $C_B'$, $C_C'$, $C_D'$, $C_E'$, ... according to one example embodiment of the present invention. Relatedly, FIG. 4 shows an example plan view of one example advantageous ROM cell $C_n'$ of the arrangement of FIG. 3. Such example ROM cell $C_n'$ may be rectangular in shape and sized at 13 microns by 7 microns (see FIG. 4), but practice of the present invention is not limited thereto. In fact, other regular and even complex shapes may be used, and as photolithography and other IC manufacturing techniques mature over time, it is expected that ROM cells of much smaller size could be manufactured.

The example ROM cell $C_n'$ may further have a cell inter-connector arrangement $I_1$, $I_2$ which allows two differing voltage levels or signals (e.g., voltages Vcc and Vss) to traverse such cell and interconnect with a similar cell inter-connector arrangement of a neighboring cell, i.e., such that the two differing voltages or signals can be made to commonly extend across a plurality of ROM cells, and such differing voltages or signals are available within a perimeter of each ROM cell. Such inter-connectors $I_1$, $I_2$ may also be considered to be receiver/source terminals. Each ROM cell also has two inputs/output terminals $O_A$, $O_A'$ which, as will become apparent in the discussions to follow, may each be programmably connected to either cell inter-connector $I_1$, $I_2$. It should be apparent and understood by those skilled in the art that the input, output, receiver and source functions of the terminals $O_A$, $O_A'$ and inter-connectors $I_1$, $I_2$ are interchangeable, i.e., the terminals $O_A$, $O_A'$ could just as equally serve as receiver/source terminals, and the inter-connectors $I_1$, $I_2$ could just as equally serve as input/output terminals.

FIG. 5 shows a plurality of plan views more clearly showing example layers and/or components of the example advantageous ROM cell of the arrangement of FIG. 4. More particularly, shown are differing plan views 100–700. The plan view 100 more specifically may contain: n-diffusion components N-DIFF shown in an upper portion of plan view 100 and commonly shaded with a first type of shading; n-well components N-WELL shown commonly outlined with dashed lines; and, polysilicon components POLY shown in a lower portion and commonly shaded with another type of shading. The plan views 200–500 show example differing metal layers METAL1, METAL2, METAL3, METAL4, respectively, the plan view 600 shows an example generic layer GLAYER, and the plan view 700 shows the example metal inter-connect layer IMETAL. Further shown throughout the plan view 100–700 are numerous vias represented by small darkened squares, such vias being made of some type of electrically conductive material (e.g., metal) extending between and being for the purpose of interconnecting overlying non-vias layers. Ones of the N-DIFF, N-WELL, POLY, METAL1, METAL2, METAL3, METAL4, GLAYER, IMETAL and vias components may be provided by differing masks (and other processes) during IC manufacture, and ones of such components may separately exist or co-exist on different layers of the ROM cell. For sake of clarity and brevity, not illustrated are insulation layers between the above-described layers, as insulation layers are well known in the art.

An advantageous arrangement of the present invention is that all of the example N-DIFF, N-WELL, POLY, METAL1, METAL2, METAL3, METAL4, GLAYER, IMETAL and vias V arrangements each contain selectably programmable components such that the example ROM cell is fully programmable at any level or layer. In beginning to discuss such programmable arrangements, FIG. 6 will be used for discussion of selectably programmable vias components. More particularly, using FIG. 6's plan view 100 as an example, shown are a pair of vias $V_7$, $V_7'$ which are selectably moveable (i.e., providable) between two positions, i.e., selectable movability being indicated by the hopping arrows in plan view 100, with each end of the hopping arrows indicating possible selectable positions. More specifically, using a simple change in a mask which is used to form the vias $V_7$, $V_7'$, such vias can be moved to (i.e., provided at) the second indicated positions.

As will become apparent in discussion presented shortly ahead, such move of vias results in a reversal of connections between the two inter-connectors $I_1$, $I_2$ and the two inputs/output terminals $O_A$, $O_A'$, i.e., if inter-connectors $I_1$, $I_2$ are connected to inputs/output terminals $O_A$, $O_A'$, respectively, while vias $V_7$, $V_7'$ are in a first position, then interconnectors $I_1$, $I_2$ will be connected to inputs/output terminals $O_A'$, $O_A$, respectively, when vias $V_7$, $V_7'$ are in the second position. Accordingly, such selectably programmable components render the example ROM cell fully programmable at this $V_7$, $V_7'$ level or layer. Similar discussion apply with respect to each of the other vias pair $V_8$, $V_8'$, $V_9$, $V_9'$, $V_{10}$, $V_{10}'$, $V_{11}$, $V_{11}'$, and $V_{12}$, $V_{12}'$ levels, shown in the FIG. 6 plan views 200–600, respectively, and hence redundant discussion is omitted for sake of brevity.

A further advantageous arrangement of the present invention, is that all of the N-DIFF, N-WELL, POLY, METAL1, METAL2, METAL3, METAL4, GLAYER, IMETAL and vias V components/layer may be stacked and substantially aligned in a vertical column for compactness, and thus the example ROM cells $C_A'$, $C_B'$, $C_C'$, $C_D'$, $C_E'$, ... can be more tightly packed with one another as shown in FIG. 3, i.e., the FIG. 1 wasted space W is avoided. Such is advantageous in terms of effective use of die space, and thus is compatible with present day trends toward increased miniaturization and lowered IC costs.

Figure 8B:
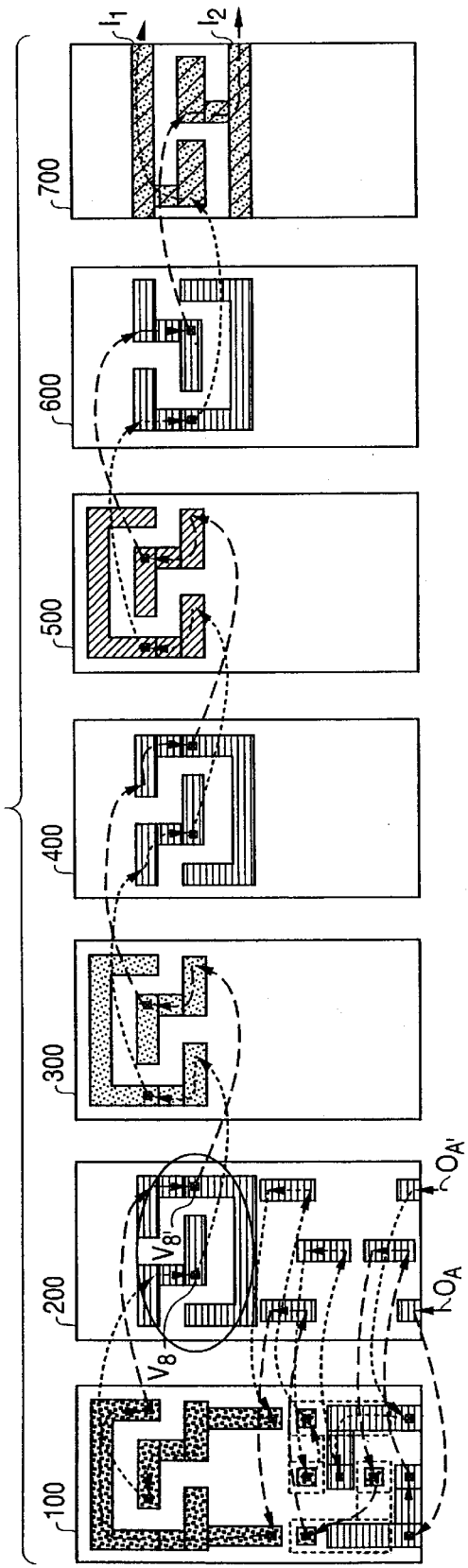
Figure 11A:
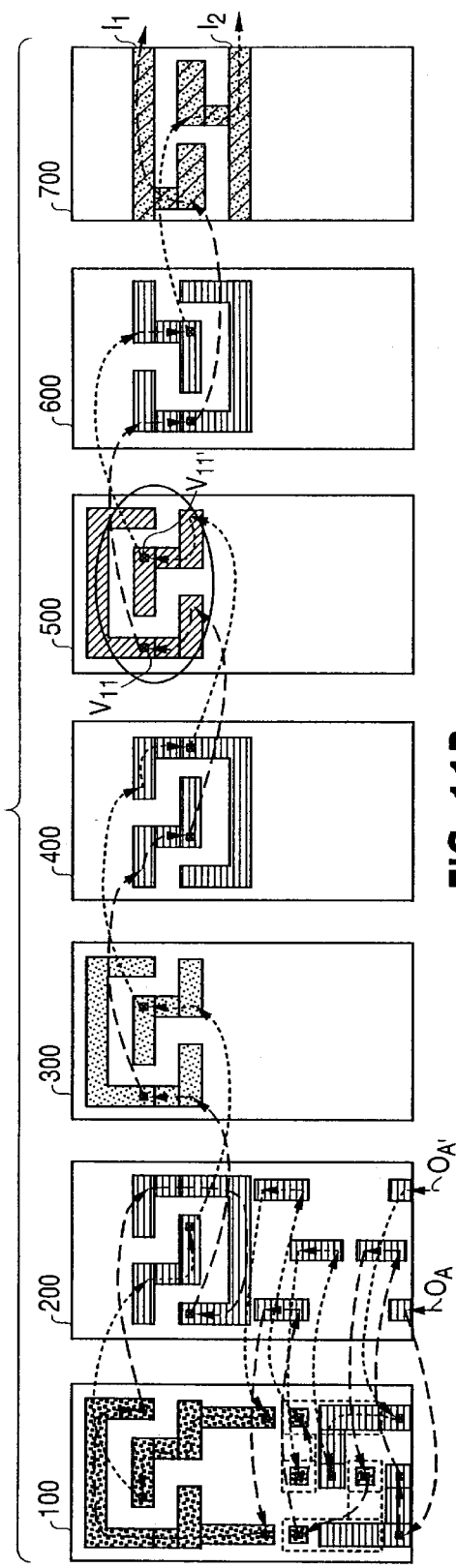
Figure 11B:
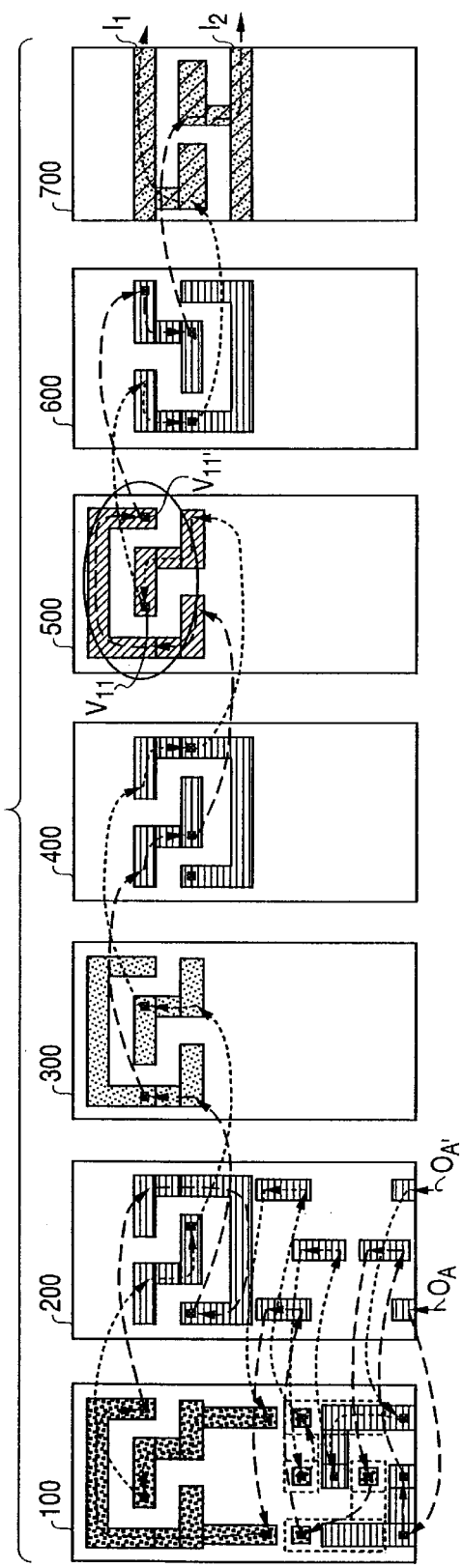

Discussion now turns to more detailed discussions/illustrations with respect to pairs of FIGS. 7A, 7B, 8A, 8B, 9A, 9B, 10A, 10B, 11A, 11B, 12A and 12B, for comprehensively showing that a programmable move of any of the vias pairs $V_7$, $V_7'$, $V_8$, $V_8'$, $V_9$, $V_9'$, $V_{10}$, $V_{10}'$, $V_{11}$, $V_{11}'$, and $V_{12}$, $V_{12}'$, results in a reversal of connections between the two inter-connectors $I_1$, $I_2$ and the two inputs/output terminals $O_A$, $O_A'$. More particularly, turning first to FIG. 7A, first arrowed lines having a first characteristic are used to show an electrical connection path initiating from the first output terminal $O_A$, and second arrowed lines of a second characteristic are used to show an electrical connection path initiating from the second output terminal $O_A'$. More particularly, such first and second arrowed lines show electrical connection paths throughout the N-DIFF, N-WELL, POLY, METAL1, METAL2, METAL3, METAL4, GLAYER, IMETAL and vias V arrangements throughout the plan views. Ends of first and second arrowed lines which jump from one plan view to another are also used to show which particular areas of neighboring layers are electrically connected with one another, e.g., via electrically conductive vias extending between ones of the N-DIFF, N-WELL, POLY, METAL1, METAL2, METAL3, METAL4, GLAYER, IMETAL components. As can be seen in FIG. 7A, with all of the N-DIFF, N-WELL, POLY, METAL1, METAL2, METAL3, METAL4, GLAYER, IMETAL and vias V arrangements in the positions indicated, the interconnectors $I_1$, $I_2$ are connected to inputs/output terminals $O_A$, $O_A'$, respectively.

Turning next to FIG. 7B, all of the N-DIFF, N-WELL, POLY, METAL1, METAL2, METAL3, METAL4, GLAYER, IMETAL and vias V arrangements are in the same positions as FIG. 7A, except that the vias pair $V_7$, $V_7'$ within the oval-enclosed area has been programmably moved from a first position to a second position. As a result of such programmable move, FIG. 7B shows that a result where there has been a reversal of connections between the two inter-connectors $I_1$, $I_2$ and the two inputs/output terminals $O_A$, $O_A'$, i.e., whereas when the FIG. 7A vias $V_7$, $V_7'$ in the first position resulted in the inter-connectors $I_1$, $I_2$ connected to inputs/output terminals $O_A$, $O_A'$ respectively. when FIG. 7B vias $V_7$, $V_7'$ are in the second position, the inter-connectors $I_1$, $I_2$ are oppositely connected to inputs/output terminals $O_A'$, $O_A$ respectively.

Similar discussions can be made with respect to each of the additional pairs of FIGS. 8A, 8B, 9A, 9B, 10A, 10B, 11A, 11B, 12A and 12B for other pairs of vias. More particularly, oval-enclosed areas within each respective pairs of A and B FIGS. highlight the selectably programmable component which has been changed between first and second positions. From viewing and understanding such FIGS., it can clearly been seen that a selectably programable move of any of the vias pairs $V_8$, $V_8'$, $V_9$, $V_9'$, $V_{10}$, $V_{10}'$, $V_{11}$, $V_{11}'$, and $V_{12}$, $V_{12}'$, at such vias layers may be used to result in a reversal of connections between the two inter-connectors $I_1$, $I_2$ and the two inputs/output terminals $O_A$, $O_A'$. Accordingly, further redundant discussion of FIGS. 8A, 8B, 9A, 9B, 10A, 10B, 11A, 11B, 12A and 12B is omitted for sake of brevity.

Returning to FIG. 6, in addition to highlighting selectably programmable vias pairs, FIG. 6 also highlights ones of a switch-contact pair $SC_{13}$, $SC_{13}'$ representing selectably programmable components of an N-WELL layer within the example ROM cell. More particularly, FIG. 6's switch-contact pair $SC_{13}$, $SC_{13}'$ is selectably moveable between two positions, selectable movability being indicated by the hopping arrows in plan view 100, with each end of the hopping arrows indicating possible selectable positions. More specifically, using a simple change in a mask which is used to form the switch-contact pair $SC_{13}$, $SC_{13}'$, such switch-contact pair can be moved to the second indicated position.

FIGS. 13A, 13B, show electrical conduction paths through the FIG. 5 plan views, and more particularly show that a programmable move of a switch-contact pair $SC_{13}$, $SC_{13}'$ within an N-WELL layer results in a reversal of connections between the two interconnectors $I_1$, $I_2$ and the two inputs/output terminals $O_A$, $O_A'$. More particularly, in FIG. 13B, all of the N-DIFF, N-WELL, POLY, METAL1, METAL2, METAL3, METAL4, GLAYER, IMETAL and vias V and switch-contact SC arrangements are in the same programmable positions as FIG. 13A, except that the switch-contact pair $SC_{13}$, $SC_{13}'$ within the oval-enclosed area has been programmably moved from a first position to a second position. Accordingly, by viewing FIGS, 13A, 13B, it can be clearly seen that in FIG. 13A, the inter-connectors $I_1$, $I_2$ are connected to inputs/output terminals $O_A$, $O_A'$, respectively, whereas in FIG. 13B a reversal of connections has been effected with the two inter-connectors $I_1$, $I_2$ being connected to inputs/output terminals $O_A'$, $O_A$, respectively.

Discussion turns next to FIG. 14. More particularly, FIG. 14 shows a plurality of plan views more clearly showing eight other selectably programmable switch-contact pairs with respect to the individual layers and/or components of the example advantageous ROM cell of the arrangement of FIG. 4. Discussion and illustration (like that set forth above with respect to all of the vias) could be made to prove that each of the illustrated eight switch-contact pairs could be used to result in a reversal of connections between the two interconnectors $I_1$, $I_2$ and the two inputs/output terminals $O_A$, $O_A'$. However, in the interest of brevity and in order to avoid monotony, discussion and more detailed illustration will be made with respect to the selectable programability of only two example switch-contact pairs. More specifically, discussion will be made with respect to the switch-contact pair $SC_{15}$, $SC_{15}'$ within the METAL# layer, and the switch-contact pair $SC_{16}$, $SC_{16}'$ within the IMETAL layer.

Turning now to the first such discussion, FIGS. 15A, 15B, show electrical conduction paths through the FIG. 14 plan views, and more particularly show that a programmable move of the switch-contact pair $SC_{15}$, $SC_{15}'$ within the METAL3 layer results in a reversal of connections between the two inter-connectors $I_1$, $I_2$ and the two inputs/output terminals $O_A$, $O_A'$. More particularly, in FIG. 15B, all of the N-DIFF, N-WELL, POLY, METAL1, METAL2, METAL3, METAL4, GLAYER, IMETAL and vias V and switch-contact SC arrangements are in the same programmable positions as FIG. 15A, except that the switch-contact pair $SC_{15}$, $SC_{15}'$ within the oval-enclosed area has been programmably moved from a first position (FIG. 15A) to a second position (FIG. 15B). Accordingly, by viewing FIGS. 15A, 15B, it can be clearly seen that in FIG. 15A, the inter-connectors $I_1$, $I_2$ are connected to inputs/output terminals $O_A$, $O_A'$, respectively, whereas in FIG. 15B a reversal of connections has been effected with the two inter-connectors $I_1$, $I_2$ being oppositely connected to inputs/output terminals $O_A'$, $O_A$, respectively.

As to the second discussion, FIGS. 16A, 16B, show electrical conduction paths through the FIG. 14 plan views, and more particularly show that a programmable move of the switch-contact pair $SC_{16}$, $SC_{16}'$ within the IMETAL layer results in a reversal of connections between the two inter-connectors $I_1$, $I_2$ and the two inputs/output terminals $O_A$, $O_A'$. More particularly, in FIG. 16B, all of the N-DIFF, N-WELL, POLY, METAL1, METAL2, METAL3, METAIL4, GLAYER, IMETAL and vias V and switch-contact SC arrangements are in the same programmable positions as FIG. 16A, except that the switch-contact pair $SC_{16}$, $SC_{16}'$ within the oval-enclosed area has been programmably moved from a first position (FIG. 16A) to a second position (FIG. 16B). Accordingly, by viewing FIGS. 16A, 16B, it can be clearly seen that in FIG. 16A, the inter-connectors $I_1$, $I_2$ are connected to inputs/output terminals $O_A$, $O_A'$, respectively, whereas in FIG. 16B a reversal of connections has been effected with the two inter-connectors $I_1$, $I_2$ being oppositely connected to inputs/output terminals $O_A'$, $O_A$, respectively.

Final discussion turns to FIGS. 17A, 17B which show plan views of a selectably programmable well arrangement, which may be used with embodiments of the present invention, e.g., with the example ROM cell. Shown within such FIGS. are: a substrate SUB; three n-diffusion regions N-DIFF$_1$, N-DIFF$_2$, N-DIFF$_{IN}$; two p-diffusion regions P-DIFF$_1$, P-DIFF$_2$; a first metal conductor M-IN connected via a contact to n-diffusion region N-DIFF$_{IN}$; a second metal conductor M-OUT$_1$ connected via contacts to n-diffusion region N-DIFF$_1$ and p-diffusion region P-DIFF$_1$; a third metal conductor M-OUT$_2$ connected via contacts to n-diffusion region N-DIFF$_2$ and p-diffusion region P-DIFF$_2$; and, a well region WELL. Connection of any of the first metal conductor M-IN, second metal conductor M-OUT$_1$, or third metal conductor M-OUT$_2$, to any of the previously discussed interconnectors $I_1$, $I_2$ or inputs/output terminals $O_A'$, $O_A$ (or other components), is well within a level of one skilled in the art, and hence unnecessary discussion/illustrations thereof will be omitted for the sake of brevity.

Discussion will now turn to the selectable programmability of the FIGS. 17A, 17B arrangement. Within FIGS. 17a, 17b the substitute SUB may be electrically connected to a voltage $V_{ss}$, whereas a metal conductor M-IN may be connected to a voltage $V_{cc}$ or any predetermined signal. By sliding a well region (shown in dashed form), appropriate voltage or signals can be connected to desired terminals.

More particularly, FIG. 17A shows a first arrangement wherein the WELL is formed in a rightward position, so as to contact the n-diffusion regions N-DIFF$_{IN}$, N-DIFF$_2$ and the p-diffusion region P-DIFF$_2$, enclosed within such well. If the WELL is diffused with n-type material, a conduction path CP$_1$ will be set up through the contacts and n-diffusion regions of the N-DIFF$_{IN}$, n-WELL and N-DIFF$_2$ so as to allow electrical conduction between the metal conductors M-IN and M-OUT$_2$. In contrast, a diode-type arrangement is set up with respect to the p-diffusion region P-DIFF$_2$ and the n-WELL, in a manner to prevent electrical conduction therebetween.

Discussion next turns to a left half of FIG. 17A. More particularly, if the substrate SUB is generally a p-type material, a conduction path CP$_2$ will be set up through the contacts and p-diffusion region P-DIFF$_1$, so as to allow electrical conduction between the substrate SUB and M-OUT$_1$. Accordingly, if the substate SUB is connected to a voltage (e.g., Vss), M-OUT$_1$ would be connected to such voltage. In contrast, a diode-type arrangement is set up with respect to the n-diffusion region N-DIFF$_1$ and the substrate SUB, in a manner to prevent electrical conduction therebetween. Accordingly, the substrate voltage $V_{ss}$ is output at M-OUT$_1$, whereas the M-IN voltage $V_{cc}$ or signal is output at M-OUT$_2$.

FIG. 17B shows the WELL selectably programmed to a second position, so as to get opposite results from that of FIG. 17A. More particularly, FIG. 17A shows a second arrangement wherein the WELL is formed in a leftward position, so as to contact the n-diffusion regions N-DIFF$_{IN}$, N-DIFF$_1$, and the p-diffusion region P-DIFF$_1$, enclosed within such well. If the WELL is diffused with n-type material, a conduction path CP$_3$ will be set up through the contacts and n-diffusion regions of the N-DIFF$_{IN}$, n-WELL and N-DIFF$_1$ so as to allow electrical conduction between the metal conductors M-IN and M-OUT$_1$. In contrast, a diode-type arrangement is set up with respect to the p-diffusion region P-DIFF$_1$ and the n-WELL, in a manner to prevent electrical conduction therebetween.

With regard to the right half of FIG. 17B, if the substrate SUB is generally a p-type material, a conduction path CP$_4$ will be set up through the contacts and p-diffusion region P-DIFF$_2$, so as to allow electrical conduction between the substrate SUB and M-OUT$_2$. Accordingly, if the substate SUB is connected to a voltage (e.g., Vss), M-OUT$_2$ would be connected to such voltage. In contrast, a diode-type arrangement is set up with respect to the n-diffusion region N-DIFF$_2$ and the substrate SUB, in a manner to prevent electrical conduction therebetween. Accordingly, the substrate voltage $V_{ss}$ is now output at M-OUT$_2$, whereas the M-IN voltage $V_{cc}$ or signal is now output at M-OUT.

As should now be understood with respect to the present invention, there are many types of switching arrangement which could be used. For example, the foregoing example embodiments described vias switching arrangements (FIGS. 6, 7a, 7b, for example) which have two via structures which are slid in parallel between two possible positions and which represents an inter-layer switching arrangement. Further, FIGS. 14, 15a, 15b, for example, describe metal slide switching arrangements where two metal connecting pads are slid in parallel between two possible positions and which represents an intra-layer switching arrangements. FIGS. 16a, 16b, for example, describe metal jumping switching arrangements where two metal conducting pads are jumped in opposition between two possible positions, and which also represents an intra-layer switching arrangement. Further, FIGS. 6, 13a, 13b, for example, describe N-well jumping switching arrangements where two N-well conducting pads are jumped in opposition between two possible positions, and again which represents an intra-layer switching arrangement. Still further, FIGS. 17a, 17b, for example, describe a sliding well which is slid between two possible positions and which also represents an intra-layer switching arrangements. Practice of the present invention is not limited to those examples, and in fact, other types of switching arrangements would equally apply.

Further, it should be apparent that the present invention could also be practice with semiconductor arrangements having a substrate and diffusions which are of the opposite types to those given in the above example embodiments.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

For example, practice of the all-layers-programmable arrangement of the invention is not limited to use with a ROM cell, but instead, could be used for many other uses, with a non-exhaustive listing of other uses including: an all-layers-programmable routing structure, for routing signals through a plurality of layers; an all-layers-programmable wiring structure; etc. Further, practice of the invention is not limited only to providing IC version numbers, but instead, could be used for many other uses, with a non-exhaustive listing of other uses including: providing register values and/or programming code for use upon IC initialization; providing an IC serial number; providing information regarding a manufacturing date/time, manufacturer, manufacturing plant, authorized uses of the IC; etc. In addition, although the example embodiment discussed includes two input/output terminals $O_A'$, $O_A$, practice of the invention is not limited to the same, i.e., practice of the invention could be made with only a singular input/output terminal, or could be made with more than two input/output terminals. Likewise, although the example embodiment discussed includes only two receiver/source terminals, practice of the invention is not limited to the same, i.e., there could be three or more receiver/source terminals. As another alternative, although the example embodiment describes each singular input/output terminal being programmably connected to only a singular receiver/source terminal, practice of the present invention is not limited to the same. For example, if any of the vias or switch-contacts are provided at both selectable positions (instead of just one position) within any of the programmable layers, then both inter-connectors $I_1$, $I_2$ would be mutually connected to inputs/outputs $O_A'$, $O_A$. In addition, each all-layers-programmable arrangement of the present invention may further include an activating/deactivating arrangement such as a switching transistor (e.g., within an electrical conduction path of such arrangement), for turn on/off an operation of such arrangement.

What is claimed is:

1. A programmable IC (integrated circuit) arrangement comprising:
   at least one input/output terminal;
   at least two receiver/source terminals for selectable electrical connection to said at least one input/output terminal; and
   a plurality of layers electrically interconnected with one another and providing electrical connection between said at least one input/output terminal and at least one of said at least two receiver/source terminals, wherein at least a sub-plurality of said plurality of layers includes electrically conductive components selectably providable at at least two positions so as to selectably program electrical connection between said at least one input/output terminal and said at least two receiver/source terminals.

2. A programmable IC arrangement as claimed in claim 1, wherein each layer of said plurality of layers includes electrically conductive components selectably providable at at least two positions so as to selectably program electrical connection between said at least one input/output terminal and said at least two receiver/source terminals.

3. A programmable IC arrangement as claimed in claim 2, wherein said electrically conductive components selectably providable at at least two positions, include ones of selectably providable vias, switch-contacts and well regions.

4. A programmable IC arrangement as claimed in claim 2, wherein said electrically conductive components selectably providable at at least two positions, include at least two different types of components selected from a group of selectably providable vias, switch-contacts and well regions.

5. A programmable IC arrangement as claimed in claim 1, wherein said sub-plurality of said plurality of layers includes at least two differing types of layers selected from the group of semiconductor well, diffusion, polysilicon, contact, metal conductor and vias layers.

6. A programmable IC arrangement as claimed in claim 1, comprising:
   at least three layers electrically interconnected with one another and providing electrical connection between said at least one input/output terminal and at least one of said at least two receiver/source terminals, wherein at least three layers of said at least three layers includes electrically conductive components selectably providable at at least two positions so as to selectably program electrical connection between said at least one input/output terminal and said at least two receiver/source terminals.

7. A programmable IC arrangement as claimed in claim 1, wherein said programmable IC arrangement is a ROM (read-only-memory) cell.

8. A programmable IC arrangement as claimed in claim 1, comprising two input/output terminals, wherein said at least a sub-plurality of said plurality of layers includes electrically conductive components selectably providable at at least two positions so as to selectably program electrical connection between said two input/output terminals and said at least two receiver/source terminals.

9. A programmable IC arrangement as claimed in claim 8, wherein portions of said at least a sub-plurality of said plurality of layers, which include said electrically conductive components are substantially stacked substantially in alignment with each other.

10. A programmable IC (integrated circuit) arrangement comprising:
   at least one input/output terminal means;
   at least two receiver/source terminal means for selectable electrical connection to said at least one input/output terminal means; and
   a plurality of layer means electrically interconnected with one another and providing electrical connection between said at least one input/output terminal means and at least one of said at least two receiver/source terminal means, wherein at least a sub-plurality of said plurality of layer means includes electrically conductive means selectably providable at at least two positions so as to selectably program electrical connection between said at least one input/output terminal means and said at least two receiver/source terminal means.

11. A programmable IC arrangement as claimed in claim 10, wherein each layer means of said plurality of layer means includes electrically conductive means selectably providable at at least two positions so as to selectably program electrical connection between said at least one input/output terminal means and said at least two receiver/source terminal means.

12. A programmable IC arrangement as claimed in claim 11, wherein said electrically conductive means selectably providable at at least two positions, include ones of selectably providable vias means, switch-contact means and well region means.

13. A programmable IC arrangement as claimed in claim 11, wherein said electrically conductive means selectably providable at at least two positions, include at least two different types of components selected from a group of selectably providable vias means, switch-contact means and well region means.

14. A programmable IC arrangement as claimed in claim 10, wherein said sub-plurality of said plurality of layer means includes at least two differing types of layer means selected from the group of semiconductor well, diffusion, polysilicon, con tact, metal conductor and vias layer means.

15. A programmable IC arrangement as claimed in claim 10, comprising:
   at least three layer means electrically interconnected with one another and providing electrical connection between said at least one input/output terminal means and at least one of said at least two receiver/source terminal means, wherein at least three layer means of said at least three layer means includes electrically conductive means selectably providable at at least two positions so as to selectably program electrical connection between said at least one input/output terminal means and said at least two receiver/source terminal means.

16. A programmable IC arrangement as claimed in claim 10, wherein said programmable IC arrangement is a ROM (read-only-memory) cell.

17. A programmable IC arrangement as claimed in claim 10, comprising two input/output terminal means, wherein said at least a sub-plurality of said plurality of layer means includes electrically conductive means selectably providable at at least two positions so as to selectably program electrical connection between said two input/output terminal means and said at least two receiver/source terminal means.

18. A programmable IC arrangement as claimed in claim 17, wherein portions of said at least a sub-plurality of said plurality of layer means, which include said electrically conductive means are substantially stacked substantially in alignment with each other.

19. A programmable IC (integrated circuit) arrangement comprising:
   at least one input/output terminal;
   at least two receiver/source terminals for selectable electrical connection to said at least one input/output terminal; and
   a plurality of layers electrically interconnected with one another and providing electrical connection between said at least one input/output terminal and at least one of said at least two receiver/source terminals, wherein at least a sub-plurality of said plurality of layers includes electrically conductive components, with each component selectably providable at at least two positions so as to selectably program electrical connection between said at least one input/output terminal and said at least two receiver/source terminals.

20. A programmable IC (integrated circuit) arrangement comprising:
   at least one input/output terminal means;
   at least two receiver/source terminal means for selectable electrical connection to said at least one input/output terminal means; and
   a plurality of layer means electrically interconnected with one another and providing electrical connection between said at least one input/output terminal means and at least one of said at least two receiver/source terminal means, wherein at least a sub-plurality of said plurality of layer means includes electrically conductive means, with each conductive means selectably providable at at least two positions so as to selectably program electrical connection between said at least one input/output terminal means and said at least two receiver/source terminal means.

21. A programmable IC (integrated circuit) arrangement comprising:
   at least one input/output terminal;
   at least two receiver/source terminals for selectable electrical connection to said at least one input/output terminal; and
   a plurality of layers electrically interconnected with one another and providing electrical connection between said at least one input/output terminal and at least one of said at least two receiver/source terminals, wherein at least a sub-plurality of said plurality of layers includes electrically conductive components, with each component selectably providable at at least two alternate positions along a corresponding electrical conduction path so as to selectably program electrical connection between said at least one input/output terminal and said at least two receiver/source terminals.

22. A programmable IC (integrated circuit) arrangement comprising:
   at least one input/output terminal means;
   at least two receiver/source terminal means for selectable electrical connection to said at least one input/output terminal means; and
   a plurality of layer means electrically interconnected with one another and providing electrical connection between said at least one input/output terminal means and at least one of said at least two receiver/source terminal means, wherein at least a sub-plurality of said plurality of layer means includes electrically conductive means, with each conductive means selectably providable at at least two alternate positions along a corresponding electrical connection path so as to selectably program electrical connection between said at least one input/output terminal means and said at least two receiver/source terminal means.

23. A programmable IC (integrated circuit) arrangement comprising:

at least one input/output terminal;

at least two receiver/source terminals for selectable electrical connection to said at least one input/output terminal; and a plurality of layers electrically interconnected with one another and providing electrical connection between said at least one input/output terminal and at least one of said at least two receiver/source terminals, wherein at least a sub-plurality of said plurality of layers includes electrically conductive components, with each component selectably providable at at least two positions so as to selectably program electrical connection between said at least one input/output terminal and said at least two receiver/source terminals, wherein a first position programs electrical connection of said at least one input/output terminal to a first receiver/source terminal of said at least two receiver/source terminals, and a different position programs electrical connection of said at least one input/output terminal to a different receiver/source terminal of said at least two receiver/source terminals.

24. A programmable IC (integrated circuit) arrangement comprising:

at least one input/output terminal means;

at least two receiver/source terminal means for selectable electrical connection to said at least one input/output terminal means; and a plurality of layer means electrically interconnected with one another and providing electrical connection between said at least one input/output terminal means and at least one of said at least two receiver/source terminal means, wherein at least a sub-plurality of said plurality of layer means includes electrically conductive means, with each conductive means selectably providable at at least two positions so as to selectably program electrical connection between said at least one input/output terminal means and said at least two receiver/source terminal means, wherein a first position programs electrical connection of said at least one input/output terminal means to a first receiver/source terminal means of said at least two receiver/source terminal means, and a different position programs electrical connection of said at least one input/output terminal means to a different receiver/source terminal means of said at least two receiver/source terminal means.

* * * * *